US 6,689,213 B2

United States Patent
Kubo et al.

(10) Patent No.: US 6,689,213 B2
(45) Date of Patent: Feb. 10, 2004

(54) SINGLE CRYSTAL PULLING APPARATUS

(75) Inventors: Takayuki Kubo, Tokyo (JP); Katsuhito Makiyama, Tokyo (JP); Tatsuya Yabusame, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/096,314

(22) Filed: Mar. 13, 2002

(65) Prior Publication Data

US 2002/0170492 A1 Nov. 21, 2002

(30) Foreign Application Priority Data

Mar. 16, 2001 (JP) ............................. 2001-076356

(51) Int. Cl.⁷ ............................................. C30B 15/00
(52) U.S. Cl. ..................................................... 117/213
(58) Field of Search ...................... 117/200, 208, 117/213, 900

(56) References Cited

U.S. PATENT DOCUMENTS

| 5,372,090 | A | * | 12/1994 | Wegmeth et al. | ............ | 117/213 |
| 5,474,022 | A | * | 12/1995 | Abe et al. | .................... | 117/214 |
| 5,879,449 | A | * | 3/1999 | Beswick | ..................... | 117/30 |
| 6,334,898 | B1 | * | 1/2002 | Bommier | .................... | 117/200 |

* cited by examiner

Primary Examiner—Felisa Hiteshew
(74) Attorney, Agent, or Firm—Morrison & Foerster, LLP

(57) ABSTRACT

To impart flexibility suitable for recovery of a quartz crucible to a divided type graphite crucible and avoid damage to the quartz crucible due to the flexibility. A graphite crucible 10 is divided into two or more parts by radial dividing lines 14. An opening 11a is provided in a center of a bottom of the graphite crucible 10. A protrusion 21 fitting into the opening 11a is provided on a crucible placing surface of a crucible tray 20. An inner diameter d2 of the opening 11a is 0.04 to 0.9 times an inner diameter d1 of a straight body portion of the graphite crucible 10. An outer diameter D2 of the crucible tray 20 is 0.5 or more times an outer diameter D1 of the straight body portion of the graphite crucible 10. Minimum thickness of the crucible tray 20 is 15 mm or more.

3 Claims, 4 Drawing Sheets

SINGLE CRYSTAL PULLING APPARATUS

BACKGROUND OF THE INVENTION

1. Field of the Invention

The present invention relates to a single crystal pulling apparatus used for growing a single crystal by a CZ method.

2. Description of the Related Art

The CZ method is often used as a method of growing a silicon single crystal used as a material for a semiconductor device. In growing the silicon single crystal by the CZ method, as shown in FIG. 3, a seed crystal 3 is immersed in a silicon melt 2 formed in a crucible 1, and from this condition, the seed crystal 3 is pulled upward while rotating the crucible 1 and seed crystal 3 to thereby grow a silicon single crystal 4 beneath the seed crystal 3.

The crucible 1 has a double structure of an inner quartz crucible 1a and an outer graphite crucible 1b. The double crucible is placed on a crucible tray 5, and moved up and down and rotated in accordance with up and down movement and rotation of a pedestal 6 supporting the crucible tray 5. The outer graphite crucible 1b is a holding crucible for reinforcing mechanical strength of the inner quartz crucible 1a. There are two types of graphite crucibles: a one body type and a divided type.

In growing the silicon single crystal by the CZ method, the size and weight of the crystal have been rapidly increased in recent years, causing crucibles of increased size to be used. When a large one body type graphite crucible is used, handling is not easy to thereby increase burden on an operator, and when a quartz crucible is recovered from the graphite crucible after pulling, the quartz crucible firmly adheres to an inner surface of the graphite crucible due to thermal expansion difference between quartz and graphite to cause problems of difficulties in recovery of the graphite crucible. Thus, for a large crucible, a divided type graphite crucible is generally used that is easier to handle and also offers easier recovery of the quartz crucible than the one body type graphite crucible.

As shown in FIG. 4, a divided type graphite crucible 1b is circumferentially divided into a plurality of parts by radial dividing lines 1d, and generally has a three way divided structure of combined three divided pieces 1c. In the divided type graphite crucible, crucible fastening means for fastening the divided pieces to be combined is used as required, and one of such fastening means is described in Japanese Patent Laid Open No. 2000-264777 specification. The described crucible fastening means has a lid-like or cap-like retainer fitted into an opening provided in a center of its bottom to thereby prevent outward fall of a plurality of divided pieces formed by circumferentially dividing the crucible, and to avoid enlarging a gap between adjacent divided pieces.

In growing the silicon single crystal by the CZ method, inner quartz crucibles have been disposable and not been reused. This is because physical and chemical damage in use is significant. However, recent studies have revealed that the quartz crucibles suffer fatal damage from use simply on their inner surface layers, and that removing the surface layers allows reuse by relatively easy recycling process. From this point of view, attempts have been made to recycle and reuse the quartz crucibles, and in such a case, using the divided type graphite crucibles is essential for recovering the quartz crucibles from the graphite crucibles.

For the divided type graphite crucible assuming that the quartz crucible is recovered and reused, it is not preferable to firmly fasten the divided pieces since it causes adhesion of the quartz crucible and difficulty in recovery. That is, the divided pieces need to have flexibility of such a degree that the divided pieces may have a slight gap therebetween. Therefore, specific fastening means is not used for firmly fastening the divided pieces, and a conventional divided structure is used where the graphite crucible is simply circumferentially divided into a plurality of parts as shown in FIG. 4. Such a simple divided type graphite crucible has flexibility of following deformation of the quartz crucible and facilitates recovery of the quartz crucible after use, while displacement of the graphite crucible itself due to the deformation of the quartz crucible may damage the quartz crucible.

That is, the quartz crucible is mainly deformed to have an enlarged opening. When the opening of the quartz crucible is enlarged, the divided pieces of the quartz crucible tilt outward like a nail puller. Specifically, each divided piece has a vertical portion formed by circumferentially dividing a straight body portion of the crucible, and a horizontal portion formed by circumferentially dividing a bottom of the crucible. When the opening of the quartz crucible is enlarged, the vertical portion falls outward to cause the horizontal portion to tilt upward pivoted on its periphery. The horizontal portion has a sharp triangular tip at its center, so that tilting due to the fall of the vertical portion causes the tip to locally push up a center of the bottom of the quartz crucible and to thereby easily damage the crucible in a softened state.

The fastening means described in Japanese Patent Laid-Open No. 2000-264777 specification completely fastens the divided pieces to eliminate their flexibility, which tends to cause adhesion of the quartz crucible. Thus, it is inappropriate as the fastening means in the divided type graphite crucible assuming that the quartz crucible is recovered and reused.

SUMMARY OF THE INVENTION

An object of the present invention is to provide a single crystal pulling apparatus capable of imparting flexibility suitable for recovery of a quartz crucible to a graphite crucible and also capable of effectively avoiding damage of the quartz crucible due to the flexibility.

In order to attain the above described object, a single crystal pulling apparatus according to the present invention includes: a quartz crucible containing a melt; a graphite crucible holding the quartz crucible, provided with an opening in a center of its bottom, and divided into two or more parts by radial dividing lines around the opening; and a crucible tray on which the graphite crucible is placed and that has a protrusion fitting into the opening on a crucible placing surface.

In the single crystal pulling apparatus according to the present invention, a plurality of divided pieces constituting the graphite crucible includes a vertical portion formed by circumferentially dividing a cylindrical straight body portion and a horizontal portion formed by circumferentially dividing a circular bottom around the opening. The protrusion fitting into the opening is provided on the crucible placing surface of the crucible tray to thereby support the quartz crucible and not to hinder displacement of the divided pieces caused by an enlarged opening of the quartz crucible. When the quartz crucible is deformed, the vertical portion of the divided piece falls outward to cause the horizontal portion to tilt upward pivoted on its periphery. However, the horizontal portion has a fan shape with an arcuate periphery and center, so that there is a low risk of damage to the bottom or the quartz crucible even when it tilts upward pivoted on its periphery.

More preferably, as a mechanism for positioning the divided pieces of the graphite crucible, an annular projection is provided on a lower surface of the bottom of the graphite crucible so as to be positioned on a periphery of the opening, and an annular recess into which the annular protrusion fits is provided on the crucible placing surface of the crucible tray. The positioning mechanism radially fastens the plurality of divided pieces constituting the graphite crucible, but allows fall and tilt caused by the enlarged opening of the quartz crucible, and does not hinder flexibility required for separation and recovery of the quartz crucible.

An inner diameter of the opening is preferably 0.04 to 0.9 times an inner diameter of the straight body portion of the graphite crucible. An inner diameter less than 0.04 times thereof causes a central end of the divided piece to tend to be sharpened and may cause damage to the bottom of the quartz crucible. Also, a protrusion of the crucible tray is thin to thereby increase the risk of breakage. On the other hand, an inner diameter more than 0.9 times thereof significantly reduces a radial dimension of the horizontal portion of the divided piece to reduce stability of the divided piece, thereby increasing the risk of a drop from the crucible tray. The most preferable inner diameter of the opening is 0.07 to 0.50 times the inner diameter of the straight body portion of the graphite crucible.

An outer diameter of the crucible tray is preferably 0.5 or more times an outer diameter of the straight body portion of the graphite crucible. An outer diameter less than 0.5 times thereof may reduce a function of radially fastening the divided pieces to cause a gap between the divided pieces to be excessively enlarged.

Minimum thickness of the crucible tray (generally, thickness of a portion provided with the annular recess) is preferably 15 mm or more. Minimum thickness less than that may cause the periphery of the crucible tray to be bent downward and cause the gap between the divided pieces to be excessively enlarged.

The present invention is especially suitable for pulling by a three or more way divided graphite crucible in which a tip of the divided piece tends to be sharpened.

DETAILED DESCRIPTION OF THE PREFERRED EMBODIMENTS

Figure 1:
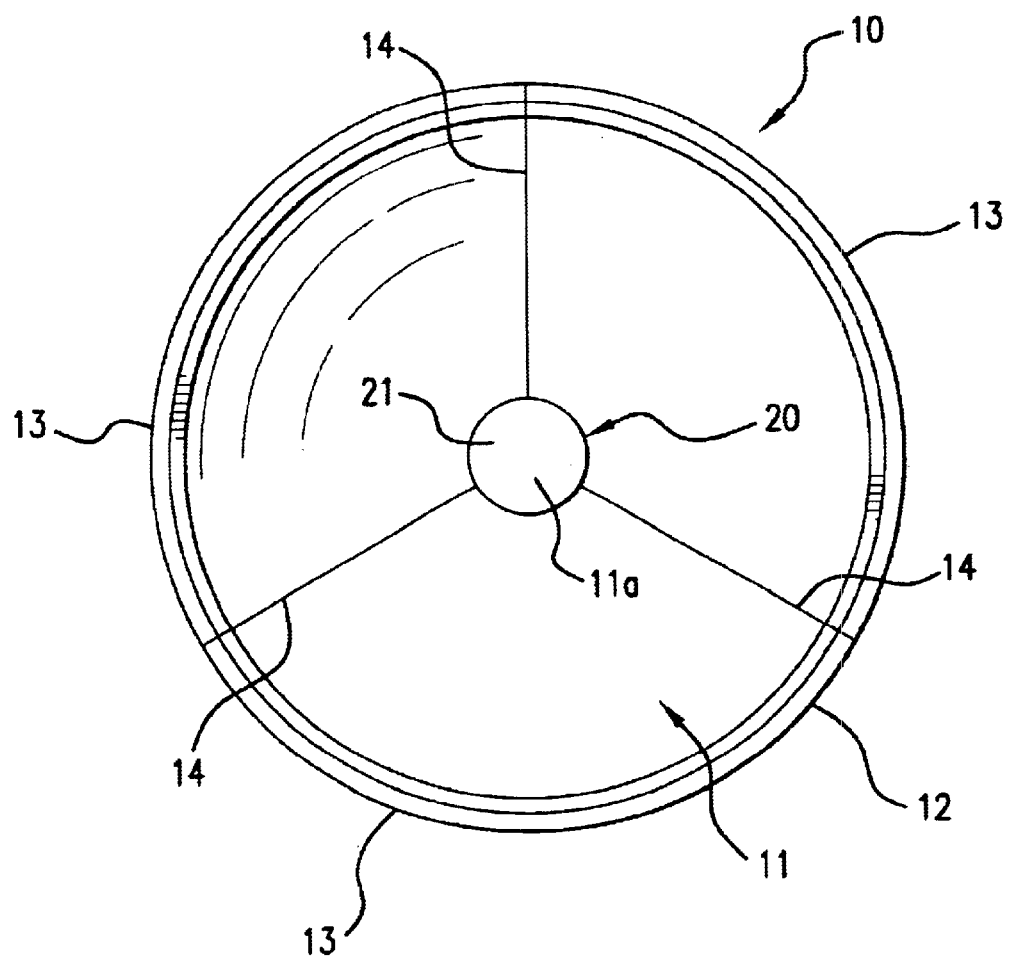
FIG. 1 is a plan view of a graphite crucible and a crucible tray according to an embodiment of the present invention.
Figure 2:
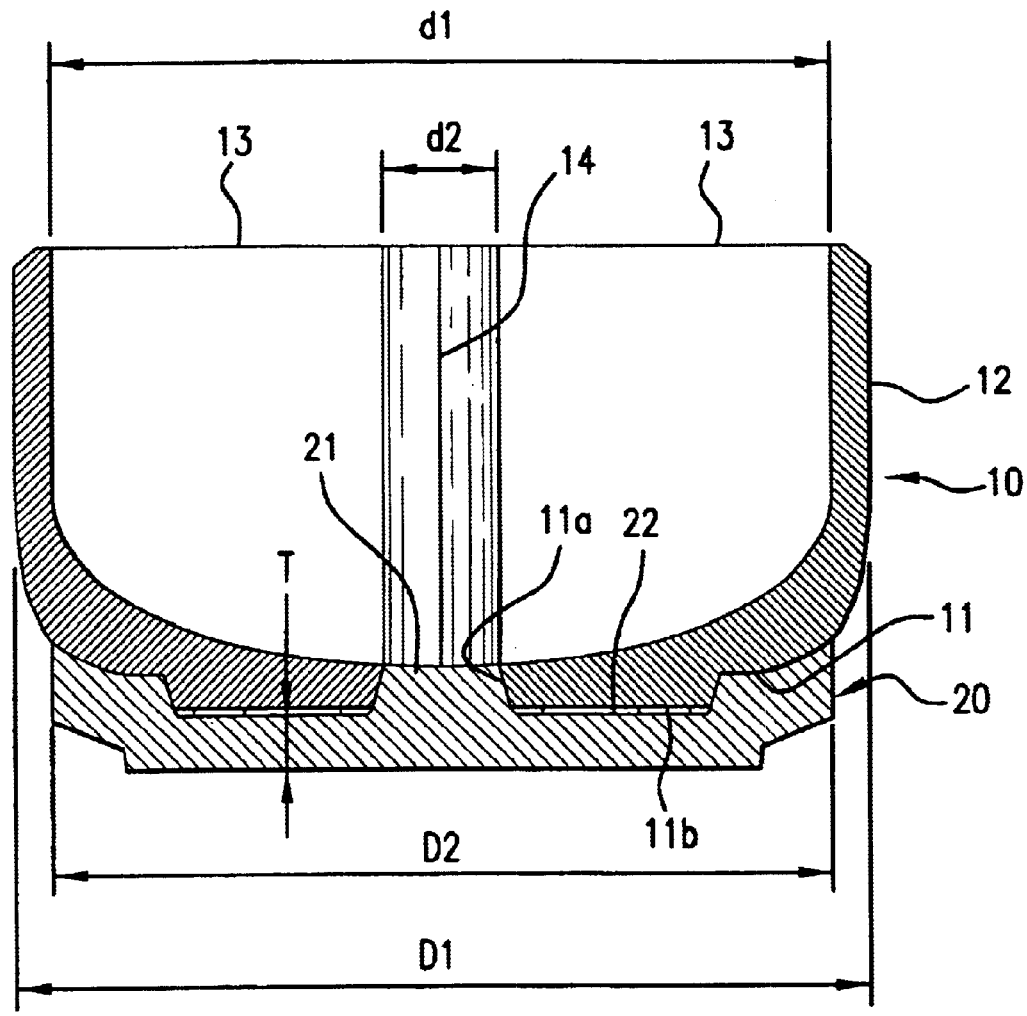
FIG. 2 is a vertical sectional view of the graphite crucible and a crucible tray.
Figure 3:
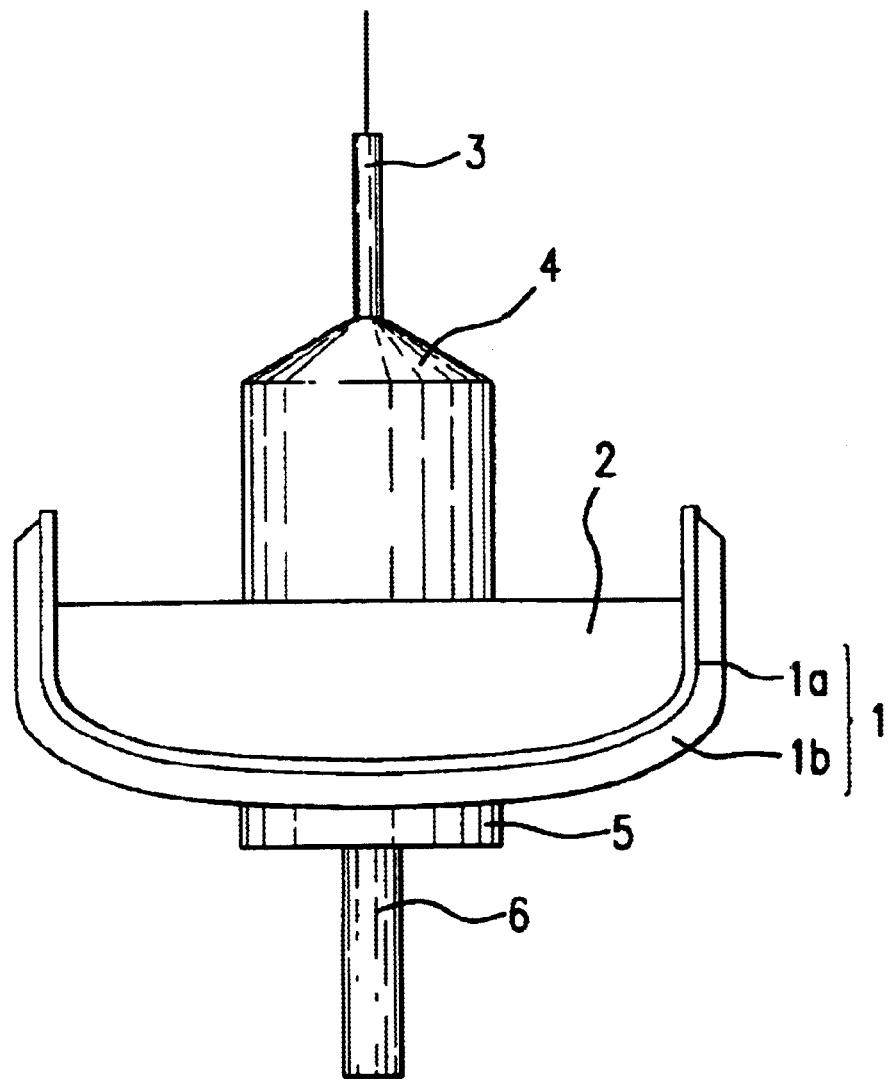
FIG. 3 shows concept of single crystal pulling by a CZ method.
Figure 4:
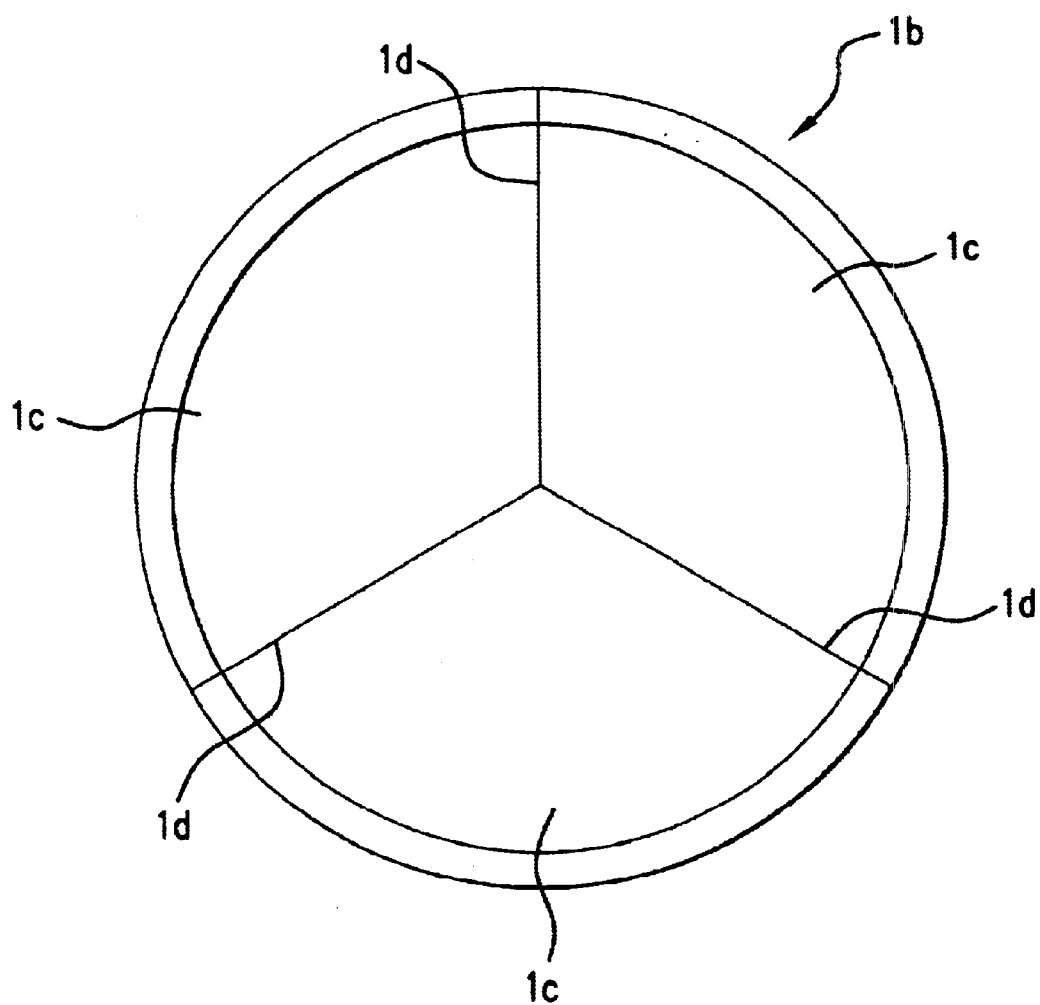
FIG. 4 is a plan view of a divided type graphite crucible used in a conventional pulling apparatus.

Now, an embodiment of the invention will be described with reference to the drawings. FIG. 1 is a plan view of a graphite crucible and a crucible tray according to an embodiment of the present invention, and FIG. 2 is a vertical sectional view of the graphite crucible and a crucible tray.

In the single crystal pulling apparatus according to this embodiment, a graphite crucible 10 is used for holding a quartz crucible. The graphite crucible 10 comprises a dome-like bottom 11 with an overall downward projection, and a straight body portion 12 extending upward from a peripheral edge of the bottom 11. In a center of the bottom 11, there is provided a circular opening 11a. An inner diameter d2 of the opening 11a is set to approximately 0.1 to 0.3 times an inner diameter d1 of the straight body portion 12 of the graphite crucible 10. On a lower surface of the bottom 11, an annular projection 11b is formed adjacent to an outside of the opening 11a, and its lower surface is flat. An upper surface of the bottom 11 is gently curved with a downward projection.

The graphite crucible 10 is circumferentially divided into three parts around the opening 11a by three radial dividing lines 14 evenly spaced circumferentially. Three divided pieces 13, 13, 13 have the same shapes, and are circumferentially combined to constitute the graphite crucible 10.

A crucible tray 20 supporting the graphite crucible 10 is made from graphite like the graphite crucible 10, and has a disk shape with an outer diameter D2 slightly smaller than an outer diameter D1 of the graphite crucible 10. In a center of an upper surface of the crucible tray 20, which is a crucible placing surface, there is provided a circular protrusion 21 fitting into the opening 11a of the graphite crucible 10. A peripheral surface of the protrusion 21 is tapered with an outer diameter gradually reduced upward, and a peripheral surface of the opening 11a is also tapered corresponding thereto. Around the protrusion 21, there is provided an annular recess 22 into which the annular projection 11b of the graphite crucible 10 fits.

In the single crystal pulling apparatus according to this embodiment, the divided pieces 13, 13, 13 are combined to constitute the graphite crucible 10. A quartz crucible is set inside the constituted graphite crucible 10. With the quartz crucible held inside, the graphite crucible 10 is placed on the crucible tray 20. The crucible tray 20 is supported by a support shaft called a pedestal.

In the pulling operation, a silicon melt is formed in the quartz crucible, and a silicon single crystal is pulled from the melt. After pulling, the graphite crucible 10 is recovered together with the quartz crucible, which is then separated from the graphite crucible 10.

In the pulling operation, the center of the bottom of the quartz crucible is directly supported by the protrusion 21 of the crucible tray 20 rather than via the graphite crucible. Also, the opening of the quartz crucible is enlarged. Then, a vertical portion 13a of each divided piece 13 falls outward to cause a horizontal portion 13b to tilt upward pivoted on a radius portion on its periphery. The crucible tray 20 does not constrain the divided piece 13 in such a fall. Thus, a gap is provided between adjacent divided pieces 13, 13 to avoid adhesion of the quartz crucible to the inner surface of the graphite crucible 10. This allows separation and recovery of the quartz crucible at a high ratio.

The annular projection 11b of the graphite crucible 10 fits into the annular recess 22 of the crucible tray 20 to thereby radially fasten the divided pieces 13, 13, 13 of the graphite crucible 10. Such a radial fastening does not hinder the above described fall of the divided piece 13, and avoids excessively enlarging a gap between the adjacent divided pieces 13, 13. This allows the quartz crucible to be surely held by the graphite crucible 10.

The fall of the divided pieces 13, 13, 13 of the graphite crucible 10 causes the bottom of the quartz crucible to be pushed up at a central end of the horizontal portion 13b of each divided piece 13. However, the central end of the horizontal portion 13b has an arcuate surface coming into contact with the circular opening 11a to thereby make line contact with the bottom of the quartz crucible, thus avoiding stress locally concentrated on the center of the bottom. This prevents damage to the quartz crucible though the fall of the divided pieces 13, 13, 13 is allowed, thereby also increasing a separation and recovery ratio of the quartz crucible.

In growing a silicon single crystal (length of its straight body portion of 1000 mm) having a diameter of 8 inch with a material charging amount of 100 kg using a quartz crucible having an inner diameter of 550 mm, a graphite crucible and a crucible tray shown in FIG. 1 and FIG. 2 were used. For the graphite crucible, the number of division was set to three (constant), an inner diameter d1 of the straight body portion to 560 mm (constant), an outer diameter D1 to 610 mm (constant), and an inner diameter d2 of an opening in a center of its bottom was changed in various ways. For the crucible tray, an outer diameter D2 and minimum thickness T were changed. For comparison, a graphite crucible without an opening in a center of its bottom (Comparative Example 1) and a graphite crucible with a lid-like fastening member fitted into an opening having an inner diameter of 100 mm (Comparative Example 2) were used.

The graphite crucible and the crucible tray were combined in various ways, and ten pieces of crystal were pulled for each combination to test a recovery ratio of the quartz crucible. The recovery ratio is a percentage of recoverable quartz crucibles in ten time pulling when it is determined recoverable that the quartz crucible removed from the graphite crucible has no deformation, fracture, and minute crack. Test results are shown in Table 1.

For the graphite crucible without the opening in the center of its bottom (Comparative Example 1), adhesion of the quartz crucible to an inner surface of the graphite crucible was effectively avoided, but a bottom of the quartz crucible was often staved in by a tip of a divided piece of the graphite crucible. Thus, a recovery ratio of the quartz crucible was low at 30%. For the graphite crucible with the lid-like fastening member fitted into the opening having the inner diameter of 100 mm (Comparative Example 2), the bottom of the quartz crucible was not staved in, but the fastening member hindered providing a gap between the divided pieces to often cause adhesion of the quartz crucible to the inner surface of the graphite crucible. Thus, the recovery ratio of the quartz crucible was similarly low at 30%.

On the other hand, for the examples of the invention comprising the graphite crucible provided with the opening in the center of its bottom and the crucible tray provided with the protrusion fitting into the opening, the recovery ratio of the quartz crucible increases up to 50% or more, or 90% or more depending on conditions. The recovery ratio especially increases when the inner diameter d2 of the opening is 0.07 to 0.50 times the inner diameter d1 of the crucible. It also increases with increasing outer diameter D2 or minimum thickness T of the crucible tray.

TABLE 1

| | INNER DIAMETER OF STRAIGHT BODY PORTION d1 (mm) | INNER DIAMETER OF OPENING d2 (mm) | d2/d1 | OUTER DIAMETER OF STRAIGHT BODY PORTION D1 (mm) | OUTER DIAMETER OF TRAY D2 (mm) | D2/D1 | THICKNESS OF TRAY (mm) | RECOVERY RATIO (%) |
|---|---|---|---|---|---|---|---|---|
| COMPARATIVE EXAMPLE 1 | 560 | — | — | 610 | 305 | 0.5 | 15 | 30 |
| COMPARATIVE EXAMPLE 2 | 560 | 100 | 0.179 | 610 | 305 | 0.5 | 15 | 30 |
| EXAMPLE OF THE INVENTION 1 | 560 | 11 | 0.02 | 610 | 305 | 0.5 | 15 | 60 |
| EXAMPLE OF THE INVENTION 2 | 560 | 22 | 0.04 | 610 | 305 | 0.5 | 15 | 90 |
| EXAMPLE OF THE INVENTION 3 | 560 | 39 | 0.07 | 610 | 305 | 0.5 | 15 | 100 |
| EXAMPLE OF THE INVENTION 4 | 560 | 280 | 0.50 | 610 | 305 | 0.5 | 15 | 100 |
| EXAMPLE OF THE INVENTION 5 | 560 | 504 | 0.90 | 610 | 305 | 0.5 | 15 | 90 |
| EXAMPLE OF THE INVENTION 6 | 560 | 532 | 0.95 | 610 | 305 | 0.5 | 15 | 70 |
| EXAMPLE OF THE INVENTION 7 | 560 | 39 | 0.07 | 610 | 244 | 0.4 | 15 | 70 |
| EXAMPLE OF THE INVENTION 8 | 560 | 39 | 0.07 | 610 | 183 | 0.3 | 15 | 60 |
| EXAMPLE OF THE INVENTION 9 | 560 | 39 | 0.07 | 610 | 305 | 0.5 | 12.5 | 60 |
| EXAMPLE OF THE INVENTION 10 | 560 | 39 | 0.07 | 610 | 305 | 0.5 | 10 | 50 |

As described above, the single crystal pulling apparatus according to the present invention comprises the divided type graphite crucible provided with the opening in the center of its bottom and the crucible tray provided with the protrusion fitting into the opening. This allows imparting flexibility suitable for recovery of the quartz crucible to the graphite crucible and also allows effectively avoiding damage to the quartz crucible due to the flexibility. Therefore, a sound quartz crucible can be recovered at a high ratio.

What is claimed is:

1. A single crystal pulling apparatus, comprising:
   a quartz crucible including a melt;
   a graphite crucible holding said quartz crucible, provided with an opening in a center of its bottom, and divided into two or more parts by radial dividing lines around said opening; and
   a crucible tray on which said graphite crucible is placed and that has a protrusion fitting into said opening on a crucible placing surface, wherein an inner diameter of said opening is 0.04 to 0.9 times an inner diameter of a straight body portion of said graphite crucible, and an outer diameter of said crucible tray is 0.5 or more times an outer diameter of the straight body portion of the graphite crucible.

2. The single crystal pulling apparatus according to claim 1, wherein an annular projection is provided on a lower surface of the bottom of said graphite crucible so as to be positioned on a periphery of said opening, and an annular recess into which said annular protrusion fits is provided on the crucible placing surface of said crucible tray.

3. The single crystal pulling apparatus according to claim 1, wherein minimum thickness of said crucible tray is 15 mm or more.

* * * * *